United States Patent [19]
Lin

[11] Patent Number: 6,084,464
[45] Date of Patent: Jul. 4, 2000

[54] ON-CHIP DECOUPLING CAPACITOR SYSTEM WITH PARALLEL FUSE

[75] Inventor: Xi-Wei Lin, Fremont, Calif.

[73] Assignee: VLSI Technology, Inc, San Jose, Calif.

[21] Appl. No.: 09/430,420

[22] Filed: Oct. 29, 1999

[51] Int. Cl.$^7$ .................................................. H01H 85/00
[52] U.S. Cl. ........................ 327/525; 327/380; 365/225.7
[58] Field of Search .................................. 327/380, 376, 327/525, 526; 326/38; 307/129; 365/225.7

[56] References Cited

U.S. PATENT DOCUMENTS

| | | | |
|---|---|---|---|
| 5,506,457 | 4/1996 | Krauter et al. | 307/129 |
| 5,789,964 | 8/1998 | Voldman | 327/380 |
| 5,828,259 | 8/1998 | Cases et al. | 327/376 |

OTHER PUBLICATIONS

Nam Pham, Moises Cases, and Bhupindra Singh "On–Chip Decoupling Capacitor Design and Modeling Methodology", *Proceedings of DesignCon*, 1999, pp. 57–70.

*Primary Examiner*—Matthew Smith
*Assistant Examiner*—Calvin Lee
*Attorney, Agent, or Firm*—Clifton L. Anderson

[57] ABSTRACT

An-on-chip decoupling capacitor system for an integrated circuit comprises parallel capacitive and fusible paths between power and ground. The capacitive path includes a field-effect-transistor based capacitor and another "capacitive-path" transistor in series with the capacitor. The fusible path includes an electromigratable fuse and a "fusible-path" transistor in series with the fuse. The capacitive-path transistor, which is controlled by the voltage at a "fusible-path" node between the fuse and the fusible-path transistor, is on during normal operation. The fusible-path transistor, which is controlled by the voltage at a "capacitive-path" node between the capacitor and the capacitive-path transistor, is off during normal operation. During normal operation, the capacitor provides local voltage regulation by sinking charge during voltage surges and supply charge during voltage drops. In the event of the capacitor is shorted due to a dielectric breakdown, the series capacitive-path transistor serves as a current limiter. A rise in voltage at the capacitive-path node turns on the fusible-path transistor—urging current through the fuse. Electromigration causes the fuse to break. This drops the voltage at the fusible-path node so that the capacitive-path transistor is turned off. At this point, there is no current through either path and the decoupling capacitor system is functionally removed from the incorporating integrated circuit.

7 Claims, 3 Drawing Sheets

ON-CHIP DECOUPLING CAPACITOR SYSTEM WITH PARALLEL FUSE

BACKGROUND OF THE INVENTION

The present invention relates to integrated circuits and, more particularly, to integrated circuits with on-chip decoupling capacitors. A major objective of the present invention is to provide a higher performance decoupling capacitor that disconnects automatically in the event of capacitor dielectric failure.

Much of modern progress is associated the increasing prevalence of computers, which is in turn made possible by advances in integrated-circuit manufacturing technology. These advances have resulted in more devices per unit area for greater functionality, faster speeds for greater processing power, and lower operating voltages for lower electrical power consumption. However, the lower operating voltages make an integrated circuit more prone to errors in the event of voltage swings in the power or ground lines. At the same time, the increasing density of rapidly switching circuit elements can generate sufficient electrical noise to cause the undesirable voltage swings.

Off-chip voltage regulation can provide steady voltages at the integrated circuit inputs. However, due to propagation latencies, local internal power transients can have sufficient time to induce errors. To supplement off-chip voltage regulation, an integrated circuit can include "decoupling" capacitors between power and ground. These decoupling capacitors serve as voltage buffers—sinking voltage during a positive voltage spike and supply voltage during a negative voltage spike.

CMOS ("complementary metal oxide silicon") is the dominant integrated-circuit manufacturing technology. It comprises transistors for which a voltage at a "gate" controls a current between a "source" and a "drain". The source and drain are separated from each other by a "channel". The gate is separated from the channel by a gate oxide (silicon dioxide). CMOS technology utilizes both NMOSFETs (n-type metal-oxide-silicon field-effect transistors) and PMOSFETs (p-type metal-oxide-silicon field-effect transistors). The "N" indicates that the majority charge carriers are negatively charged electrons; the "P" indicates that the majority charge carries are positively charged electron holes.

A decoupling capacitor can be implemented by tying the gate to a power source and coupling the source and the drain to each other and to ground. The gate and corresponding gate oxide area can be made larger than for switching transistors to provide sufficient capacitance for the decoupling. Such decoupling capacitors can be inserted in an integrated circuit wherever the layout permits. Collectively, such decoupling capacitors can provide for fast local voltage regulation throughout an integrated circuit.

Large-area gate oxides have shorter lifetimes and are more prone to manufacturing defects than are small-area gate oxides. In the case of a decoupling capacitor, failure of the gate oxide can result in a permanent damage to the integrated circuit as power is shorted to ground. To address this problem, Nam Pham, Moises Cases, and Bhupindra Singh in "On-Chip Decoupling Capacitor Design and Modeling Methodology", *Proceedings of DesignCon,* 1999, pp. 57–70, discloses a decoupling capacitor with its gate tied to power through a electromigratable fuse, and its source and drain coupled to ground through a transistor that is on during normal operation. In the event of a failure of the decoupling capacitor, the transistor limits the current between power and ground. In the meantime, the current is sufficient to break the fuse due to electromigration. This functionally removes the decoupling capacitor system from the incorporating integrated circuit. Still intact decoupling capacitors would continue regulating local voltages.

The electromigratable fuse is a narrow metal wire so its resistance is high. This high resistance in series with a decoupling capacitor limits the latter's response to voltage transients. Thus, addressing the problem of capacitor defects has incurred a cost in terms of the performance of intact decoupling capacitors. What is needed is a design for a decoupling capacitor that provides for device protection in the event of capacitor failure without interfering with the capacitor's ability to perform its voltage-regulation function.

SUMMARY OF THE INVENTION

The present invention provides a decoupling capacitor system with parallel electrical paths between power and ground. A capacitor and a "capacitive-path" transistor are in series along one path, while a fuse and a "fusible-path" transistor are in series along the other path. Each path defines a voltage node between its elements. The voltage at each node is connected to the gate of the transistor in the parallel path.

The decoupling capacitor can incorporate NMOSFET transistors, PMOSFET transistors, or both. The following summary emphasizes the NMOSFET case. Where a PMOSFET is used instead of an NMOSFET, the order of the elements in the respective path is inverted.

In the all NMOSFET case, the capacitor can be a large-area-gate NMOSFET transistor with its gate tied to power. The source and drain of the capacitor transistor can be coupled to the drain of the NMOS capacitive-path transistor; the source of the capacitive-path transistor can be tied to ground. The NMOSFET fusible-path transistor in the fusible path has its source tied to ground; its drain is coupled to one end of the fuse. The other end of the fuse is tied to power. The fuse is preferably a conductor that fails due to electromigration in the event of a high current. Alternatively, the fuse can be a low-melting-point metal.

Each node of each path controls the path transistor of the other path. The drain of the capacitive-path transistor serves as the capacitive-path node, and is connected to the gate of the fusible-path transistor. The drain of the fusible-path transistor serves as the fusible path node, and is connected to the gate of the capacitive-path transistor.

During normal operation, neither electrical path conducts. In the case of the second path, the node is coupled to power through the fuse, and coupled to ground through the fusible-path transistor. During normal operation, the fusible-path transistor is off, so the voltage at the fusible-path node is high. Thus, the capacitive-path transistor is on. The source of the capacitive-path transistor is thus electrically connected to ground, but the connection to power is broken by the capacitor. Thus, the capacitive-path node is held low. This is consistent with the fusible-path transistor being held off.

In the event the capacitor dielectric fails, there is current from power through the capacitor through the normally-on capacitive-path transistor. The capacitive-path transistor serves as a current limiter to protect the incorporating integrated circuit. In the meantime, the voltage at the capacitive-path node, which is now shorted to power, goes up. This turns on the fusible-path transistor.

Once the fusible-path transistor is on, there is current through the fusible path and thus through the fuse. Fusible-path transistor is designed so that its saturation current is at least twice the current required for the fuse to fail. In the preferred case of a electromigratable fuse, the saturation current is at least twice the electromigration limit for the fuse. Accordingly, the fuse soon breaks the current between power and ground through the fusible path.

At the moment the fuse is broken, the fusible-path node is no longer coupled to power, but is coupled to ground. The voltage at the fusible-path node falls, turning off the capacitive-path transistor. After this, there is no current through either path. The capacitive system is functionally removed from the incorporating integrated circuit. The voltage-regulation function of the capacitive system is assumed by similar but intact decoupling-capacitor systems distributed throughout the integrated circuit.

Thus, the present invention provides a decoupling capacitor system to provide local power regulation in an integrated circuit. Furthermore, the invention provides for automatic removal of a decoupling capacitor in the event of its failure by virtue of a fuse breaking. A feature of the present invention is that the fuse is not in series with the capacitor. The resulting responsive to voltage fluctuations is a major advantage of the invention: circuit protection is provided without impairing voltage regulation. These and other features and advantages of the invention are apparent from the description below with reference to the following drawings.

DESCRIPTION OF THE PREFERRED EMBODIMENTS

Figure 1:
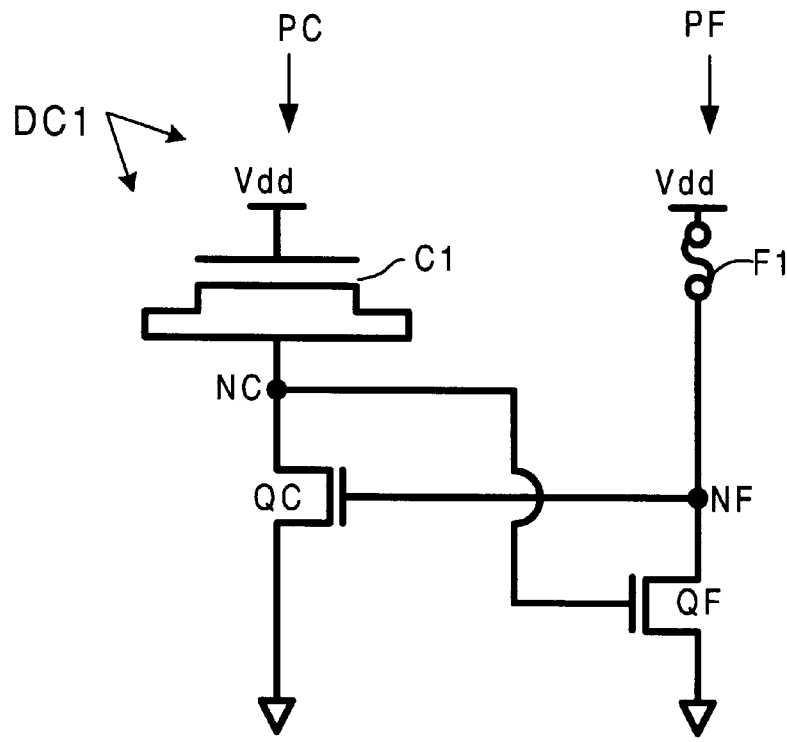
FIG. 1 is a schematic diagram of an on-chip decoupling capacitor system incorporating NMOSFET transistors in accordance with the present invention.

In accordance with the present invention, an NMOSFET-only decoupling-capacitor system DC1 for a 0.2-micron technology integrated circuit comprises a capacitive electrical path PC and a parallel fusible electrical path PF, as shown in FIG. 1. Both paths extend between power (Vdd) and ground. Capacitive path PC includes a capacitor C1 and a "capacitive-path" NMOSFET QC. Fusible path PF includes a fuse F1 and a "fusible-path" NMOSFET QF.

Capacitor C1 is an NMOSFET with its source and its drain coupled to each other. This NMOSFET has its gate coupled to power. The gate and gate oxide of this NMOSFET have a relatively large area of 8 microns (other 0.2-micron technology embodiments cover the range of 5–10 microns$^2$, in contrast to 1 micron$^2$ for a typical switching transistor in 0.2-micron technology) to provide a useful amount of capacitance for assisting voltage regulation on an incorporating integrated circuit.

Capacitive-path NMOSFET QC has a drain tied to the mutually connected source and drain of capacitor C1. The connection between capacitive-path NMOSFET QC and capacitor C1 defines a capacitive-path voltage node NC. The source of capacitive-path NMOSFET QC is tied to ground. Capacitive-path NMOSFET QC is designed with a saturation current of 2 milliamps (other 0.2-micron technology embodiments cover the range of 0.5 to 5.0 milliamps), sufficiently low that the incorporating integrated circuit will not be damaged in the event of a failure of capacitor C1.

Fuse F1 is a thin strip of aluminum, 0.2 microns thick, 0.2 microns long, and 10 microns long. Its resistance is about 2 Ω, and its migration limit is about 1 milliamp. (More generally, resistances between 1–50 Ω are preferred). Fuse F1 is coupled at one end to power and at the other end to the drain of fusible-path NMOSFET QF. This connection defines a fusible-path voltage node NF. The source of fusible-path NMOSFET QF is tied to ground. The saturation current of fusible-path NMOSFET is selected to be substantially greater than the electromigration limit of fuse F1. Specifically, fusible-path NMOSFET QF has a saturation current of about 5 milliamps, approximately five times the electromigration limit of fuse F1.

The gate of fusible-path NMOSFET QF is connected to capacitive-path voltage node NC. Complementarily, the gate of capacitive-path NMOSFET QC is connected to fusible-path voltage node NF. Thus, a voltage at the opposing node NF, NC controls each NMOSFET QC, QF.

Figure 2:
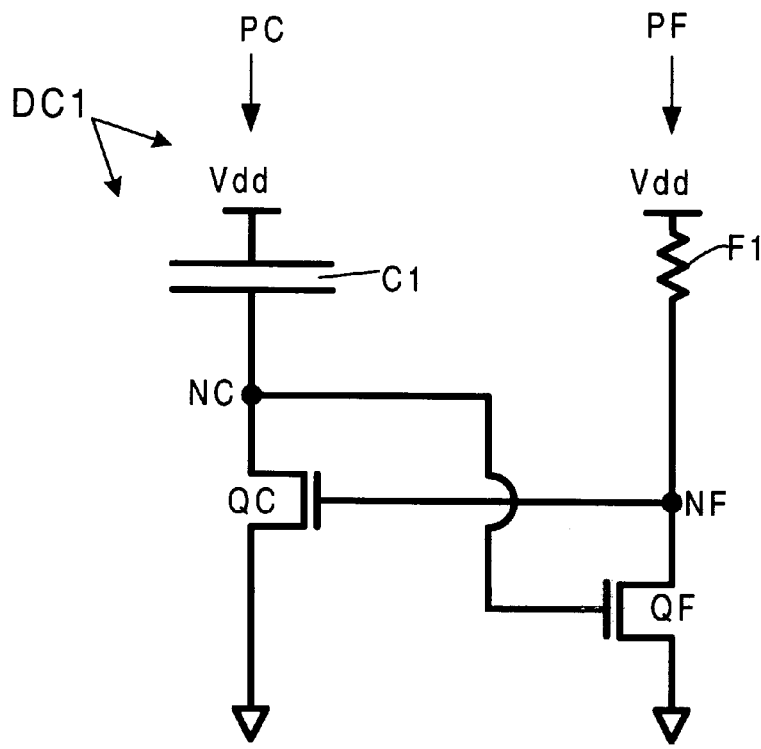
FIG. 2 is a circuit equivalent of the decoupling capacitor system of FIG. 1.

While fuse F1 is intact, it functions as a resistor, as indicated in circuit-equivalent diagram FIG. 2. This resistance is in parallel with capacitor C1. Compared to the series capacitor and resistor arrangement taught by Pham et al., cited above, there is a substantial reduction in the RC delay in reacting to voltage fluctuations in the power to ground voltage differential. Given an integrated circuit with the circuit density corresponding to a 0.2-micron feature size and a switching rate of about 500 MHz, this delay reduction is critical in regulating switching-induced voltage fluctuations. Thus, the present invention allows a decoupling-capacitor to perform its primary function more effectively.

During normal operation, fusible-path node NF is coupled through resistive fuse F1, but is effectively decoupled from ground since fusible-path NMOSFET QF is off. The voltage at fusible-path node NF is thus high. Correspondingly, capacitive-path NMOSFET QC is held on. This couples capacitive-path node NC to ground, while it is isolated (from a dc standpoint) from power. Thus, the voltage at capacitive-path node NC is held low, maintaining fusible-path NMOSFET QF off.

Because of its relatively large expanse of gate oxide, capacitor C1 is more likely than most circuit elements to fail due to dielectric breakdown. The large area of thin gate oxide is relatively likely to include a fatal contaminant particle. Also, the large area makes the gate oxide more likely to fail due to variations in thickness over its cross section.

Figure 3:
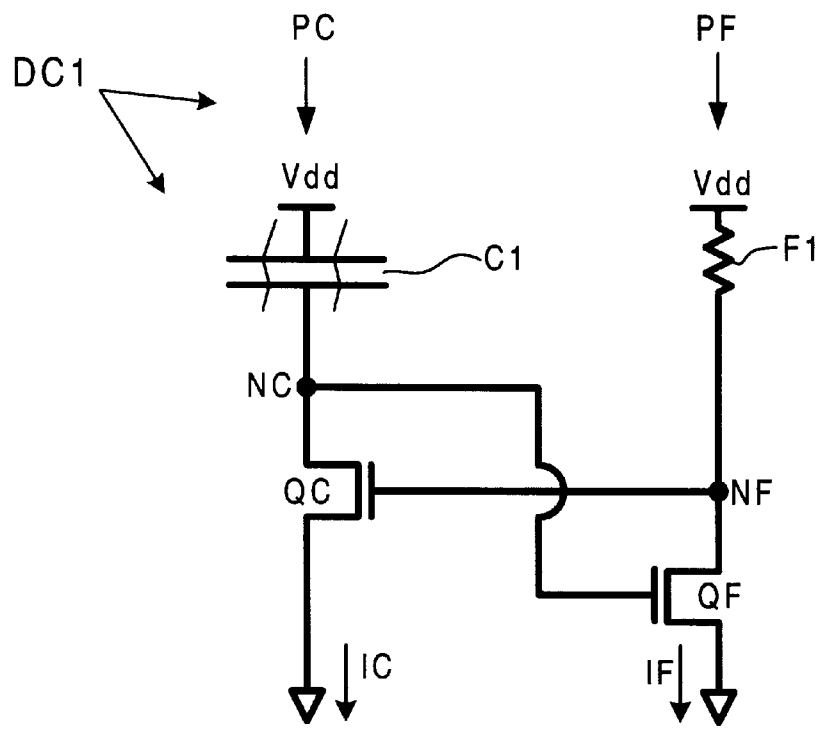
FIG. 3 is a circuit diagram of the decoupling capacitor system of FIG. 1 immediately after failure of the capacitor dielectric.

The operation of decoupling-capacitor system DC upon breakdown of the gate oxide is represented in FIG. 3. Since capacitive path NMOSFET is on during normal operation, it is on at the instant of dielectric breakdown. Accordingly, there is a current through capacitive path PC. This current is limited by the saturation current of capacitive-path NMOSFET QC so that damage to the incorporating integrated circuit is avoided.

As capacitive-path voltage node NC is now shorted to power, it voltage rises sufficiently to turn on fusible-path NMOSFET QF. The resulting current is limited by the saturation current of fusible-path NMOSFET QF. This saturation current is selected to be well above the electromigration limit of fuse F1; fuse F1 is the current limiting device for fusible path PF. Note that, once fusible-path NMOSFET QF is on, fusible path PF becomes a voltage divider. The voltage at fusible-path node falls to an intermediate value, further limiting the current through capacitive-path NMOSFET QP.

Figure 4:
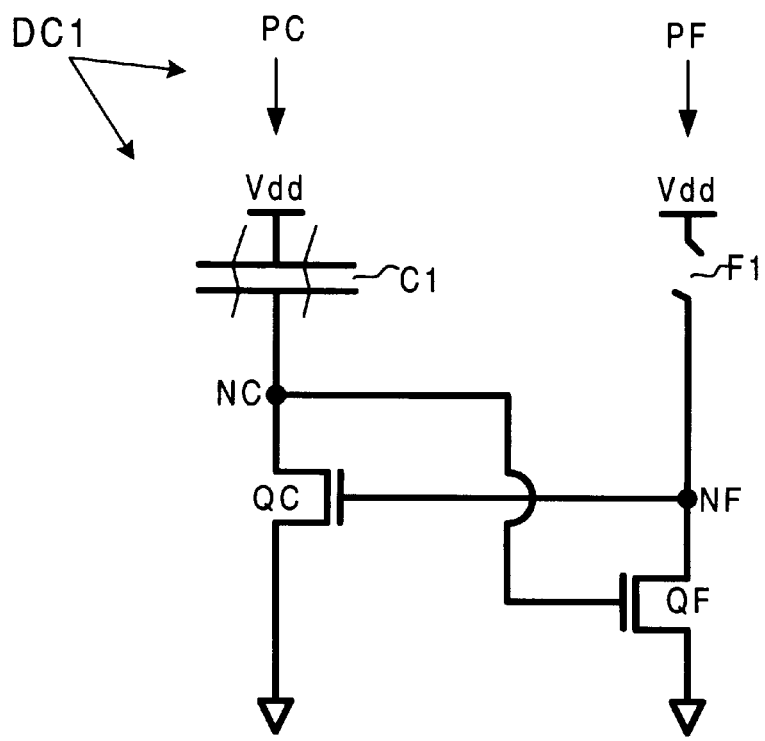
FIG. 4 is a circuit diagram of the decoupling capacitor system of FIG. 1 after functional removal of the capacitor from the incorporating integrated circuit.

In the illustrated embodiment, the saturation current of fusible-path NMOSFET QF is about five times the electromigration limit for fuse F1. Accordingly, fuse Fl breaks within a millisecond after capacitive failure. At this time, the voltage at fusible-path node NF goes low, shutting off capacitive-path NMOSFET QC. There is no current through capacitive path PC because capacitive-path NMOSFET QC is off; there is no current through fusible path PF because fuse F1 is broken. Thus, there is no current through decoupling capacitor system DC, which is thus functionally removed from the incorporating integrated circuit. This condition of decoupling capacitor system DC is represented in FIG. 4.

The following table summarizes the chronology for decoupling capacitor system DC.

TABLE

Decoupling Capacitor System Chronology

| Condition | Capacitor | QC | Fuse | QF | Currents |
| --- | --- | --- | --- | --- | --- |
| Normal operation | Intact | On | Intact | Off | None |
| Dielectric failure | Shorted | On | Intact | On | Both (PC & PF) |
| Functional removal | Shorted | Off | Broken | On | None |

Figure 5:
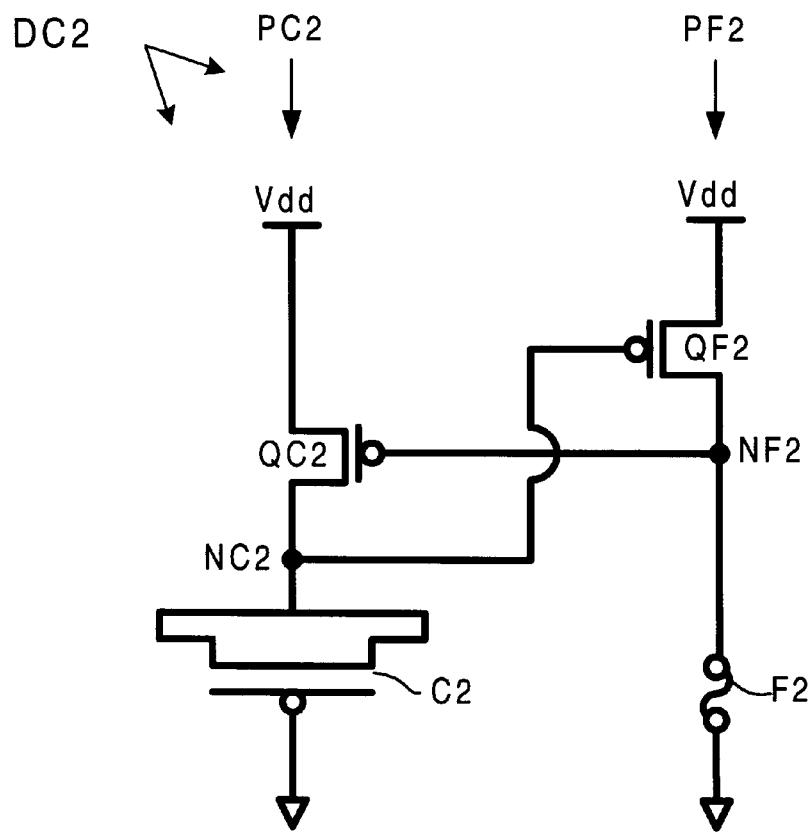
FIG. 5 is a schematic diagram of an on-chip decoupling capacitor incorporating PMOS transistors in accordance with the present invention.

A second decoupling capacitor DC2 utilizing only PMOSFETs is shown in FIG. 5. A capacitive path PC2 extends from power Vdd to a capacitive-path PMOSFET QC2 through a capacitive-path node NC2 and through PMOSFET-based capacitor C2 to ground. A fusible path PF2 extends from power Vdd through a fusible-path PMOSFET QF2 through a fusible-path node NF2 and through a fuse F2 to ground. Capacitive-path PMOSFET is controlled by the voltage at fusible-path node NF2, while fusible-path PMOSFET is controlled by the voltage at capacitive-path node NC2. The operation of decoupling capacitor DC2 is analogous to the operation of decoupling capacitor DC1 of FIG. 1.

Figure 6:
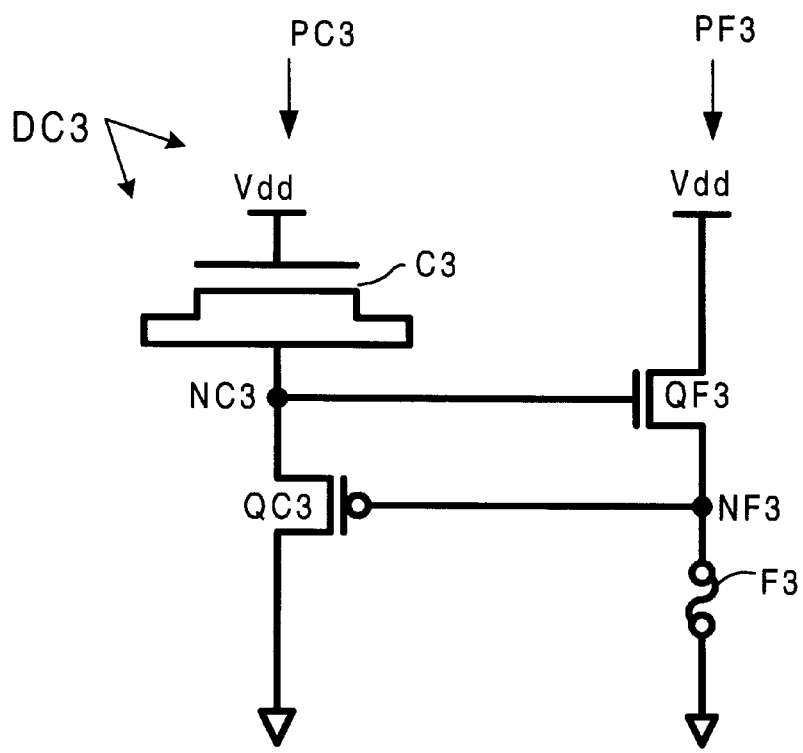
FIG. 6 is a schematic diagram of an on-chip decoupling capacitor incorporating both NMOSFET and PMOSFET transistors in accordance with the present invention.

A third decoupling capacitor DC3 utilizing a capacitive-path PMOSFET and a fusible-path NMOSFET is shown in FIG. 6. A capacitive path PC3 extends from power Vdd through an NMOSFET-based capacitor C3 through a capacitive-path node NC3 through capacitive-path PMOSFET QC3 to ground. A fusible path PF3 extends from power Vdd through fusible-path NMOSFET QF3 through a fusible-path node NF3 through fuse F3 to ground. The voltage at fusible-path node NF3 controls capacitive-path PMOSFET QC3, while capacitive-path node NC3 controls fusible-path NMOSFET QF3. The operation of decoupling capacitor DC3 is analogous to the operation of decoupling capacitor DC1 of FIG. 1.

The invention also provide for an embodiment with an NMOSFET capacitive-path transistor and a PMOSFET fusible-path MOSFET. Either a NMOSFET-based capacitor or a PMOSFET-based capacitor can be used with any combination of path transistor types.

The present invention provides for a wide variety of alternatives to the illustrated embodiment. For example, capacitor C1 and fuse F1 are designed for manufacturing ease and compatibility with the rest of the incorporating integrated circuit. However, functional equivalents of these elements can be employed. The capacitor need not be based on a field-effect transistor and need not use a gate oxide as the dielectric. (In fact, a thicker dielectric can be use to make breakdown less likely.)

The fuse need not be aluminum, and need not rely on electromigration for breaking. For example, a "fusible" metal with a relatively low melting point can be used for the fuse. The fuse would melt from heat generated by the current through the fuse. As technology develops, it becomes more practicable to use fuses with narrower cross sections. This will permit fusible-path transistors with smaller saturation currents. Other variations upon and modification to the described embodiments are provided for by the present invention, the scope of which is defined by the following claims.

What is claimed is:

1. A decoupling-capacitor system for an integrated circuit, said integrated circuit having a power source and a ground plane, said system comprising:

a capacitive path, said capacitive path including a capacitor and a capacitive-path transistor in series between said power source and said ground plane, said capacitive path defining a capacitive-path voltage node between said capacitor and said capacitive-path transistor; and a fusible path, said fusible path including a fuse and a fusible-path transistor in series between said power source and said ground plane, said fusible path defining a fusible-path voltage node between said fuse and said fusible-path transistor, said fusible-path transistor having a gate coupled to said capacitive-path voltage node, said capacitive-path transistor having a gate coupled to said fusible-path voltage node.

2. A system as recited in claim 1 wherein said fuse has an electromigration limit and said fusible-path transistor has a drain saturation current more than twice said electromigration limit.

3. A system as recited in claim 1 wherein said capacitive-path transistor and said fusible-path transistor are both NMOSFETs, said capacitor being coupled to said power source and said capacitive-path transistor, said capacitive-path transistor having a capacitive-path drain coupled to said capacitor and a capacitive-path source coupled to said ground plane, said capacitive-path voltage node being coupled to said capacitor and said capacitive-path drain.

4. A system as recited in claim 3 wherein said fuse is coupled to said power source and said fusible-path transistor, said fusible-path transistor having a fusible-path drain coupled to said fuse and a fusible-path source coupled to said ground plane, said fusible-path node being coupled to said fusible-path drain.

5. A system as recited in claim 1 wherein capacitive-path transistor and said fusible-path transistor are both PMOSFETs, said capacitor being coupled to said power source and said capacitive-path transistor, said capacitive-path transistor having a capacitive-path source coupled to said capacitor and a capacitive-path drain coupled to said ground plane, said capacitive-path voltage node being coupled to said capacitor and said capacitive-path source.

6. A system as recited in claim 5 wherein said fuse is coupled to said power source and said fusible-path transistor, said fusible-path transistor having a fusible-path source coupled to said fuse and a fusible-path drain coupled to said ground plane, said fusible-path node being coupled to said fusible-path source.

7. A system as recited in claim 1 wherein one of said capacitive-path transistor and said fusible-path transistor is an NMOSFET and the other is a PMOSFET.

\* \* \* \* \*